(12) United States Patent
Katsuura et al.

(10) Patent No.: US 7,395,573 B2
(45) Date of Patent: Jul. 8, 2008

(54) DUST REMOVER AND DUST REMOVAL METHOD

(75) Inventors: Nobuo Katsuura, Sagamihara (JP); Atsunori Nakata, Sagamihara (JP); Ryoji Saito, Sagamihara (JP)

(73) Assignee: NIX, Inc., Kanagawa (JP)

( * ) Notice: Subject to any disclaimer, the term of this patent is extended or adjusted under 35 U.S.C. 154(b) by 69 days.

(21) Appl. No.: 11/498,582

(22) Filed: Aug. 3, 2006

(65) Prior Publication Data
US 2008/0028551 A1    Feb. 7, 2008

(51) Int. Cl.
*B08B 1/04* (2006.01)
*G02F 1/13* (2006.01)

(52) U.S. Cl. ............................ 15/88.3; 15/77
(58) Field of Classification Search .......... 15/88.2, 15/88.3, 77
See application file for complete search history.

(56) References Cited

U.S. PATENT DOCUMENTS 6,385,805 B2 * 5/2002 Konishi et al. ............ 15/77
6,446,296 B1 * 9/2002 Middendorf et al. ....... 15/77
2002/0184720 A1 * 12/2002 Frost et al. ................ 15/77
2003/0000550 A1 * 1/2003 Middendorf et al. ....... 134/6

FOREIGN PATENT DOCUMENTS

JP    2003-334499    11/2003
JP    2005-211722    8/2005

* cited by examiner

*Primary Examiner*—David B Thomas
(74) *Attorney, Agent, or Firm*—Hamre, Schumann, Mueller & Larson, P.C.

(57) ABSTRACT

A dust remover includes: a rotary brush for removing dust from a workpiece; a workpiece carrying unit for carrying the workpiece in a first direction; a brush rotation unit for rotating the rotary brush around its axis in synchronization with the movement of the workpiece carrying unit; and a back-and-forth brush movement unit for moving the rotary brush back and forth along its axis, a second direction intersecting with the first direction, in synchronization with the movement of the workpiece carrying unit.

10 Claims, 11 Drawing Sheets

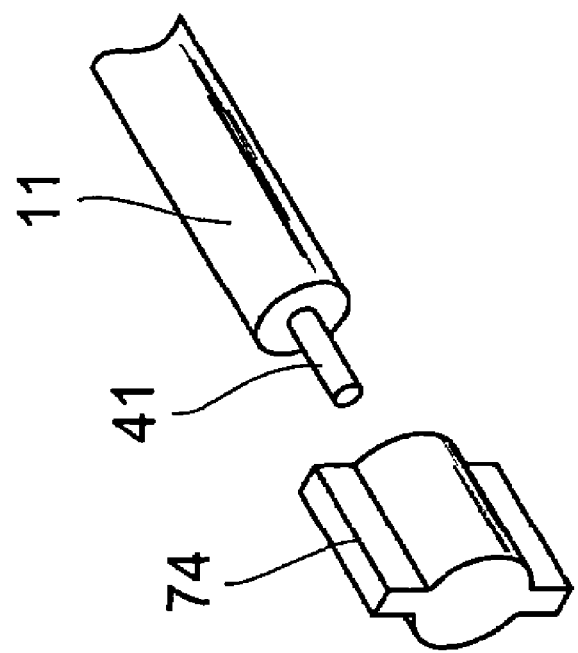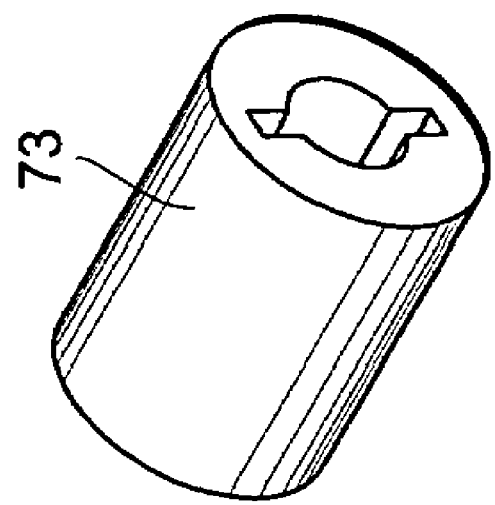

DUST REMOVER AND DUST REMOVAL METHOD

CROSS-REFERENCES TO RELATED APPLICATIONS

This application relates to Japanese Patent Application No. 2004-018702, filed on Jan. 27, 2004, the entire disclosure of which is incorporated herein by reference.

BACKGROUND

1. Field of the Invention

The present invention relates to a dust remover and a dust removal method for removing dust from a workpiece.

2. Description of Related Art

The type of dust remover generally used includes: a unit for carrying various workpieces such as glass substrates; a rotary brush for wiping dust off a workpiece by rotating while in contact with the surface of the workpiece being carried; and a dust collector for suctioning air and the dust attached to the rotary brush and removing them (for example, as described in JP-A-2003-334499, p. 2 and FIG. 9). In this case, the rotation direction of the rotary brush is set to the direction opposite to the direction the workpiece is carried.

This dust remover having the above-described structure is useful because it can be downsized and it can effectively remove dust. However, in consideration of factors such as the properties of the surfaces of various workpieces, further improvements of the dust remover in its ability to sufficiently remove the dust from the workpieces are desired. Also, dust removal movements other than the rotational motion of the rotary brush are desired.

SUMMARY

It is an object of the invention to provide a dust remover and a dust removal method that can remove dust from a workpiece more efficiently.

To achieve this object, a dust remover according to an aspect of the invention includes: a brush for removing dust from a workpiece; a workpiece carrying unit for carrying the workpiece relative to the brush in a first direction; and a brush movement unit for moving the brush relative to the workpiece in a second direction intersecting with the first direction in synchronization with the movement of the workpiece carrying unit.

According to this constitution, the dust remover can remove dust from workpiece. This new removal motion (or relative movement) of the brush can be applied to the conventional dust removal motion and widens the applicability of the apparatus in its entirety. Since the workpiece and the brush move relatively in the two directions, the workpiece carrying unit and the brush movement unit can be made with simple structures.

There are three types of relative movements of the workpiece and the brush: the first type is where the brush is moved while the workpiece is being carried; the second type is where the workpiece is carried relative to the unmoving brush and also moved in a direction intersecting with the direction the workpiece is carried; and the third type is where the brush is moved relative to the unmoving workpiece in a first direction and also in a second direction intersecting with the first direction. The first type is useful because the size of the apparatus configuration does not have to be increased so much.

Examples of types of the workpiece include printed wiring boards, liquid crystal glass substrates, flexible substrates, ceramic substrates, plastic plates, liquid crystal display panels, vacuum trays, lenses, light guide plates, films, and paper. The contour of the workpiece may be rectangular or disk-shaped like that of a wafer as described later.

It is preferable that the brush movement unit relatively moves the brush back and forth in the second direction in synchronization with the movement of the workpiece carrying unit.

According to this constitution, the brush can remove dust more effectively. Furthermore, the size of the apparatus can be reduced by, for example, shortening the length of the brush itself.

It is preferable that the brush is composed of a rotary brush, and the dust remover further includes a brush rotation unit for rotating the rotary brush around its axis in synchronization with the movement of the workpiece carrying unit.

According to this constitution, since the dust removal motion by rotation of the rotary brush is added, the brush can remove dust more effectively, as if brushing the dust from the workpiece.

It is preferable that the second direction intersecting with the first direction is a direction perpendicular to the first direction.

Since the two relative movement directions of the workpiece and the brush intersect with each other, the workpiece carrying unit and the brush movement unit can be made in simple configurations that can be easily assembled.

A dust remover according to another aspect of the invention includes: a rotary brush for removing dust from a workpiece; a workpiece carrying unit for carrying the workpiece in a direction intersecting with the axis of the rotary brush; a brush rotation unit for rotating the rotary brush around its axis in synchronization with the movement of the workpiece carrying unit; and a back-and-forth brush movement unit for moving the rotary brush back and forth along its axis in synchronization with the movement of the workpiece carrying unit.

According to this constitution, since the rotary brush is rotated relative to the carried workpiece, and the rotary brush is also moved back and forth along its rotation axis, it can remove dust from the workpiece more efficiently. In this case, it is possible to enhance workability because the workpiece is moving. Furthermore, since the brush is moved (back and forth) as the dust removal motion without further moving the workpiece being carried, the total size of the apparatus can be reduced.

It is preferable that an input part for the brush rotation unit is formed at one end of the rotary brush, and an input part for the back-and-forth brush movement unit is formed at the other end of the rotary brush.

This apparatus configuration can be made more simply than the configuration where the end of the brush rotation unit and the end of the back-and-forth brush movement unit are placed together at one end of the rotary brush.

The brush rotation unit preferably includes: a motor as a drive source; and a power transmitter that transmits of the motor rotation to the rotary brush while allowing the rotary brush to move back and forth. The back-and-forth brush movement unit also preferably includes: an actuator as a drive source; and a power transmitter that converts the power of the actuator to a back-and-forth motion for the rotary brush and transmits the back-and-forth motion to the rotary brush while allowing the rotary brush to rotate.

According to this constitution, the brush rotation unit and the back-and-forth brush movement unit can function efficiently in association with each other without interfering in each other's motion.

The actuator is preferably composed of a motor, and the power transmitter of the back-and-forth brush movement unit is composed of a reciprocating slider crank mechanism having a slider that holds the end of the rotary brush in such a manner that the end of the rotary brush can rotate.

In this configuration, the reciprocating slider crank mechanism, which is a simple mechanism, can make the rotary brush move back and forth appropriately. Furthermore, this configuration is more advantageous in terms of adjustment of the back-and-forth movement amplitude of the rotary brush, than the case where a cylinder device or similar is used as the actuator. Moreover, since the slider holds the rotary brush in such a manner that the rotary brush can rotate, the rotations of the rotary brush described above are permitted. In another embodiment, the motor for the brush rotation unit can also serve as a motor for the back-and-forth brush movement unit.

The reciprocating slider crank mechanism preferably includes: a connecting rod with its first end connected to the slider; and a crank connected to the second end of the connecting rod and also to an output part of the motor. An adjuster capable of adjusting the connection distance between the connecting rod and the motor is also preferably incorporated into the crank.

According to this constitution, the connection distance between the connecting rod and the motor, that is, the crank length can be adjusted, and therefore it is possible to adjust the amount or amplitude of back-and-forth movement of the rotary brush. Accordingly, the apparatus configuration can be determined appropriately according to the type of the workpiece.

The direction in which the workpiece is carried by the workpiece carrying unit is preferably perpendicular to the direction in which the rotary brush is moved back and forth by the back-and-forth brush movement unit.

In this configuration, the workpiece carrying unit, the brush movement unit and the brush rotation unit can be assembled easily in association with each other, and the configuration of the dust remover can be made simple and compact in its entirety.

A dust remover according to a further aspect of the invention includes: a brush for removing dust from the surface of a disk-shaped workpiece; a workpiece rotation unit for rotating the workpiece around its center; and a brush movement unit for moving the brush along a radius of the workpiece in synchronization with the rotation of the workpiece by the workpiece rotation unit.

According to this constitution, dust can be removed from the workpiece just like in the cases described above by moving the brush relative to the disk-shaped rotating workpiece along a radius of the workpiece. Examples of the disk-shaped workpiece include wafers and disk media such as CDs (compact disks).

The brush movement unit preferably moves the brush back and forth along a radius of the workpiece.

According to this constitution, the brush can remove dust effectively and the length of the brush can be shortened, thereby contributing to a reduction in the size of the apparatus.

The brush is preferably composed of a rotary brush, and the dust remover also preferably includes a brush rotation unit for rotating the rotary brush around its axis in synchronization with the rotation of the workpiece by the workpiece rotation unit.

According to this constitution, since the dust removal motion by the rotation of the rotary brush is added, the brush can remove dust from the workpiece more effectively.

The brush is preferably configured so that it can come into contact with the workpiece.

The brush configured as described above in contact with the workpiece operates to brush dust from the workpiece, and it can remarkably enhance the dust removal effect.

A dust removal method according to the invention is a method for removing dust from a workpiece by relatively moving a brush positioned opposite the workpiece, wherein the brush is moved relative to the workpiece in a first direction and also in a second direction intersecting with the first direction.

In this configuration, the new brush removal motion (or relative movement) of the brush can remove dust from the workpiece and enhance the dust removal effect like in the cases described above. This brush removal motion can be applied to the conventional dust removal motion, and a highly versatile dust removal motion can be achieved.

In this case, examples of the workpiece include not only rectangular workpieces, but also disk-shaped workpieces. In the latter case, the brush may be moved relatively along the circumferential direction of the workpiece and also along a radius of the workpiece.

The brush is preferably composed of a rotary brush, and the rotary brush is made to rotate in contact with the workpiece while it is moved relative to the workpiece in the first and second directions.

According to this constitution, the brush can remove dust from the workpiece as if brushing the dust.

BRIEF DESCRIPTION OF THE DRAWINGS

FIGS. 5A and 5B are perspective views showing a spline boss and a spline shaft respectively.

DETAILED DESCRIPTION OF PREFERRED EMBODIMENTS

Preferred embodiments of the dust remover and the dust removal method according to the invention will be explained with reference to the attached drawings. This dust remover serves to remove dust and dirt from the surfaces (or top faces) of various workpiece substrates. The dust removal motion of the dust remover is the brush being moved relative to the workpiece in two directions. The dust and dirt on the workpiece will hereinafter be collectively referred to as "dust." The first embodiment will describe the case where the workpiece has a rectangular contour, and the second embodiment will describe the case where the workpiece has a disk-shaped contour.

First Embodiment

Figure 1:
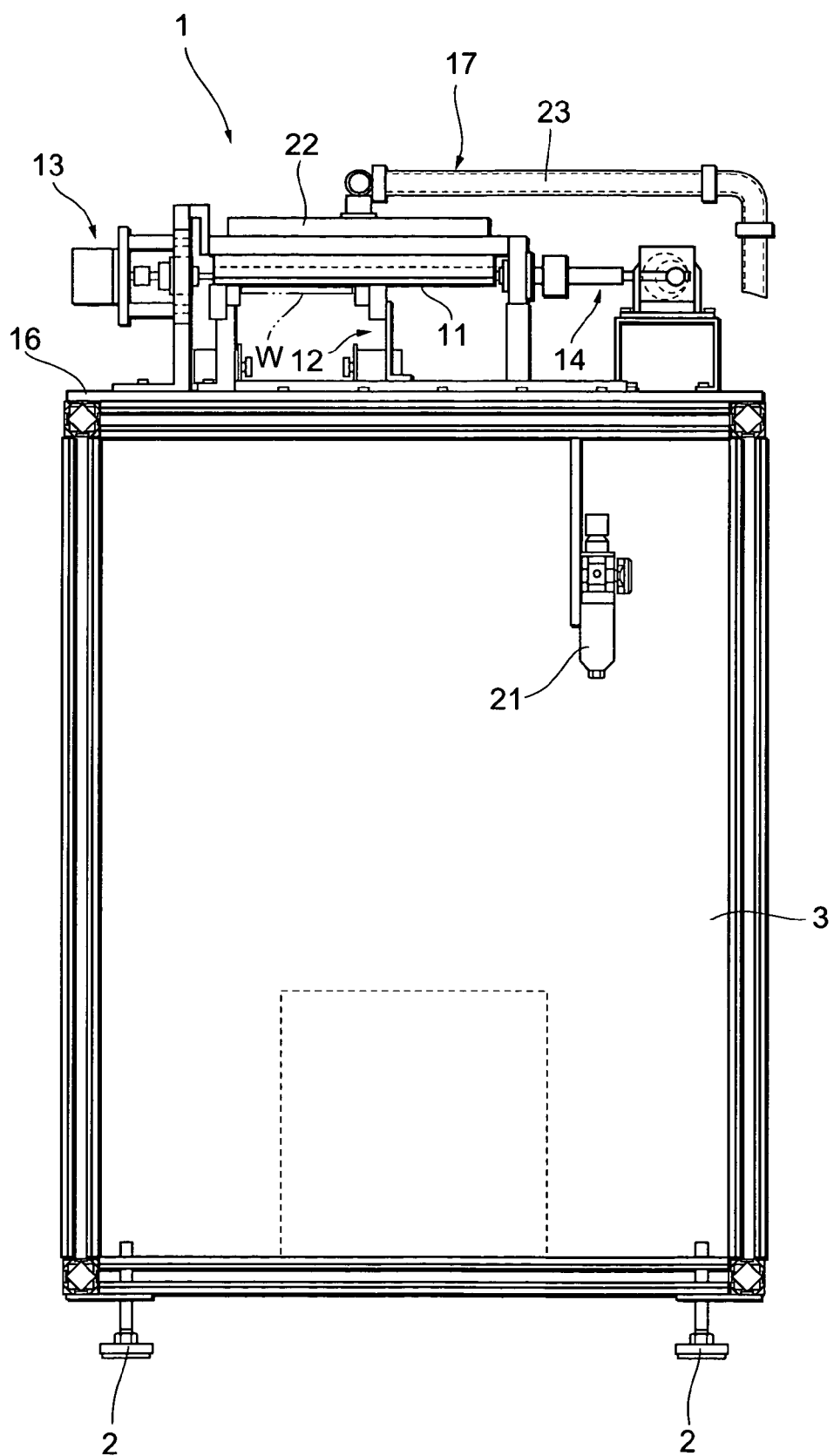
FIG. 1 is a front view of a dust remover according to a first embodiment of the invention.
Figure 2:
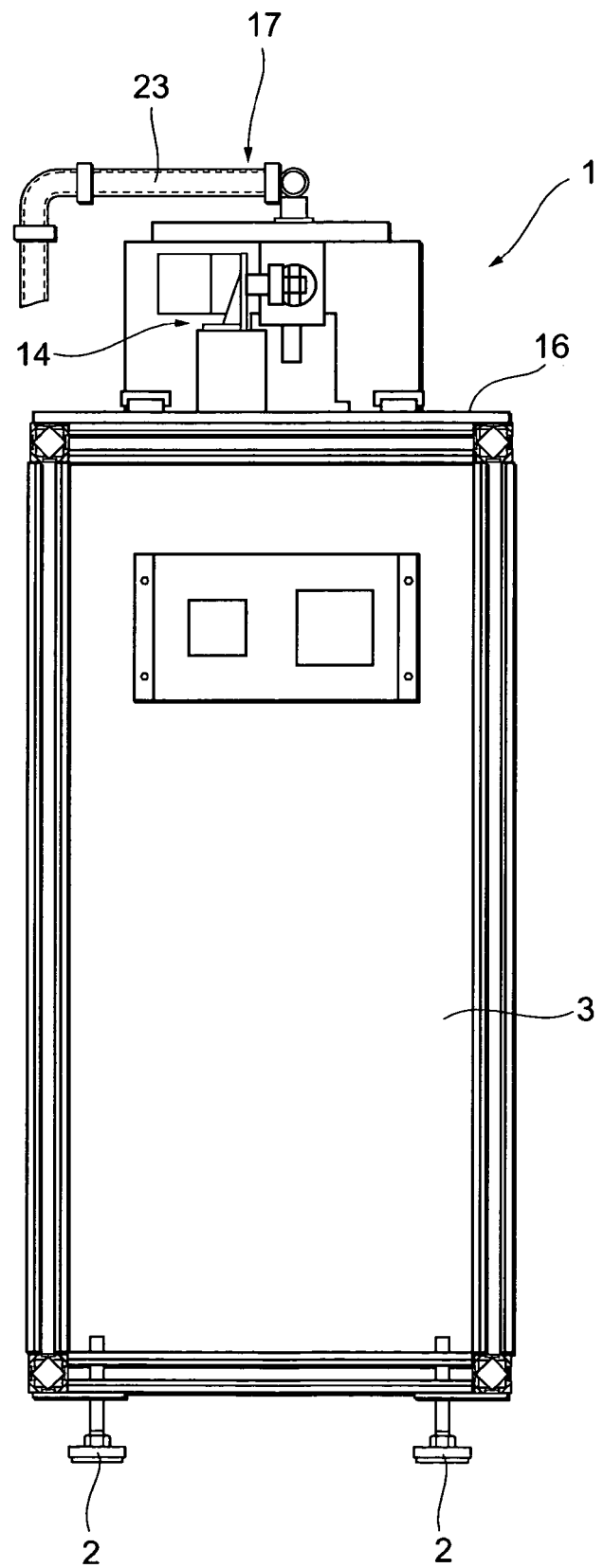
FIG. 2 is a right side view of the dust remover shown in FIG. 1.

As shown in FIGS. 1 and 2, a dust remover 1 has a workpiece processing area on a mounting 3 supported at its four corners by four support legs 2 and uses its various components assembled on the mounting 3 to perform motions to remove dust from workpiece W (a substrate) introduced into the workpiece processing area.

The following components are placed in the workpiece processing area: a rotary brush 11 for removing dust from the workpiece W; a workpiece carrying unit 12 for carrying the workpiece W in one direction (a first direction); a brush rotation unit 13 for rotating the rotary brush 11 around its axis in synchronization with the movement of the workpiece carrying unit 12; and a back-and-forth brush movement unit 14 for moving the rotary brush 11 back and forth along its axis in synchronization with the movement of the workpiece carrying unit 12. These units 12, 13, and 14 are mounted on a common base 16 secured on top of the mounting 3. The direction the workpiece W is carried is perpendicular to the back-and-forth motion direction of the rotary brush 11.

The dust remover 1 is also equipped with a dust collector 17 for suctioning and exhausting air and the dust attached to the rotary brush 11. The dust collector 17 includes: an air blowing mechanism 21 for directly spraying air onto the workpiece W; a dust collecting hood 22 placed directly above the rotary brush 11; and a vacuum mechanism that has an exhaust pipe 23 connected to the dust collecting hood 22. The vacuum mechanism suctions the dust along with the air and exhausts it to outside the workpiece processing area. The air sprayed onto the workpiece W is directed by the rotation of the rotary brush 11 toward the dust collecting hood 22.

While the dust collector 17 is active and the workpiece W is being carried, the dust removal motion of the dust remover 1 is performed by driving the brush rotation unit 13 and the back-and-forth brush movement unit 14 in synchronization with the movement of the workpiece carrying unit 12 and rotating the rotary brush 11, which is located above the workpiece W, around its axis and also moving the rotary brush 11 back and forth. As a result, dust on the entire surface of the workpiece W can be removed.

Next, the workpiece carrying unit 12, the rotary brush 11, the brush rotation unit 13, and the back-and-forth brush movement unit 14 will be explained in detail in the order listed above with reference to FIGS. 3 to 9.

Figure 3:
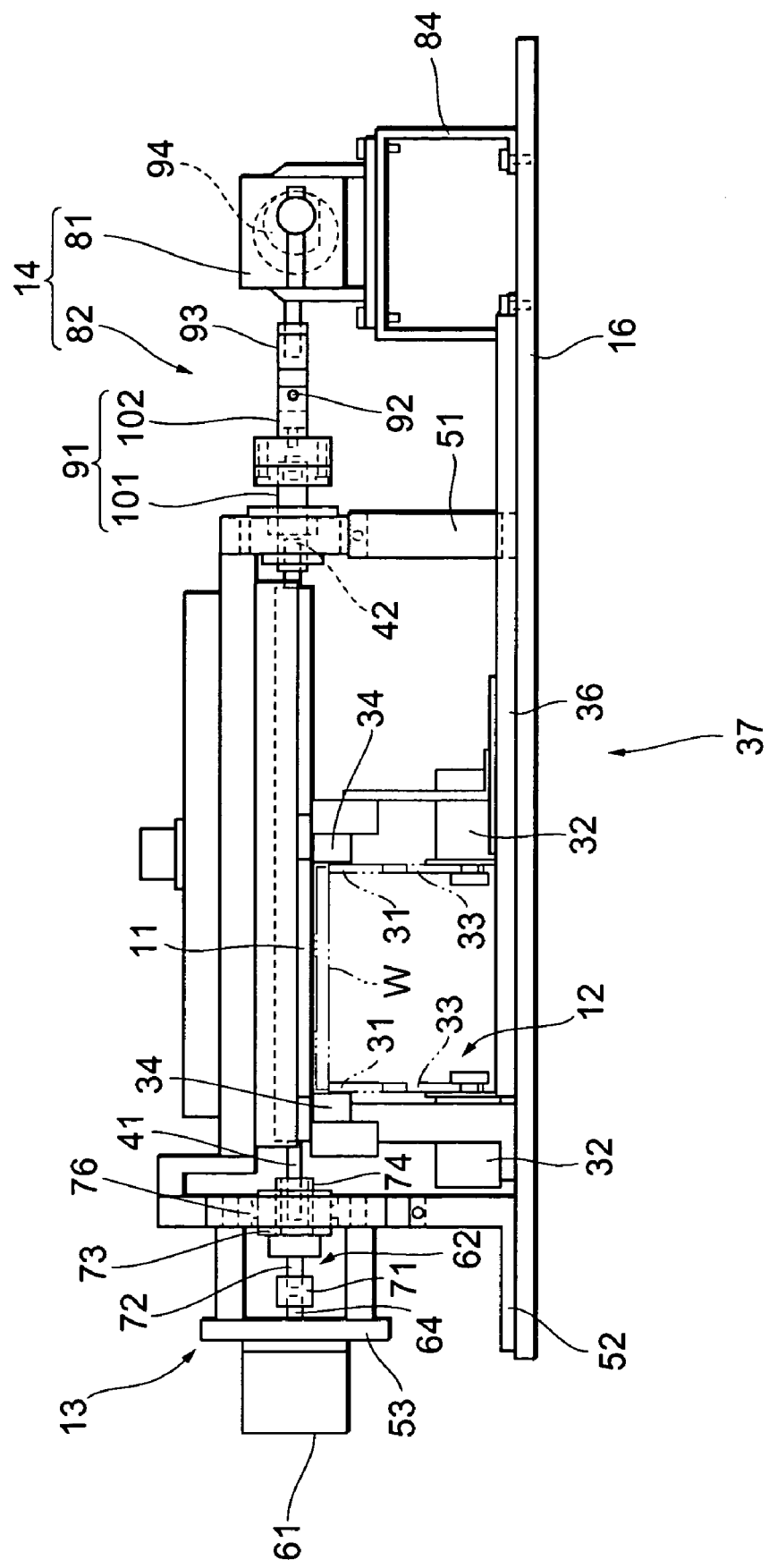
FIG. 3 is an enlarged front view illustrating various components of the dust remover shown in FIG. 1.
Figure 4:
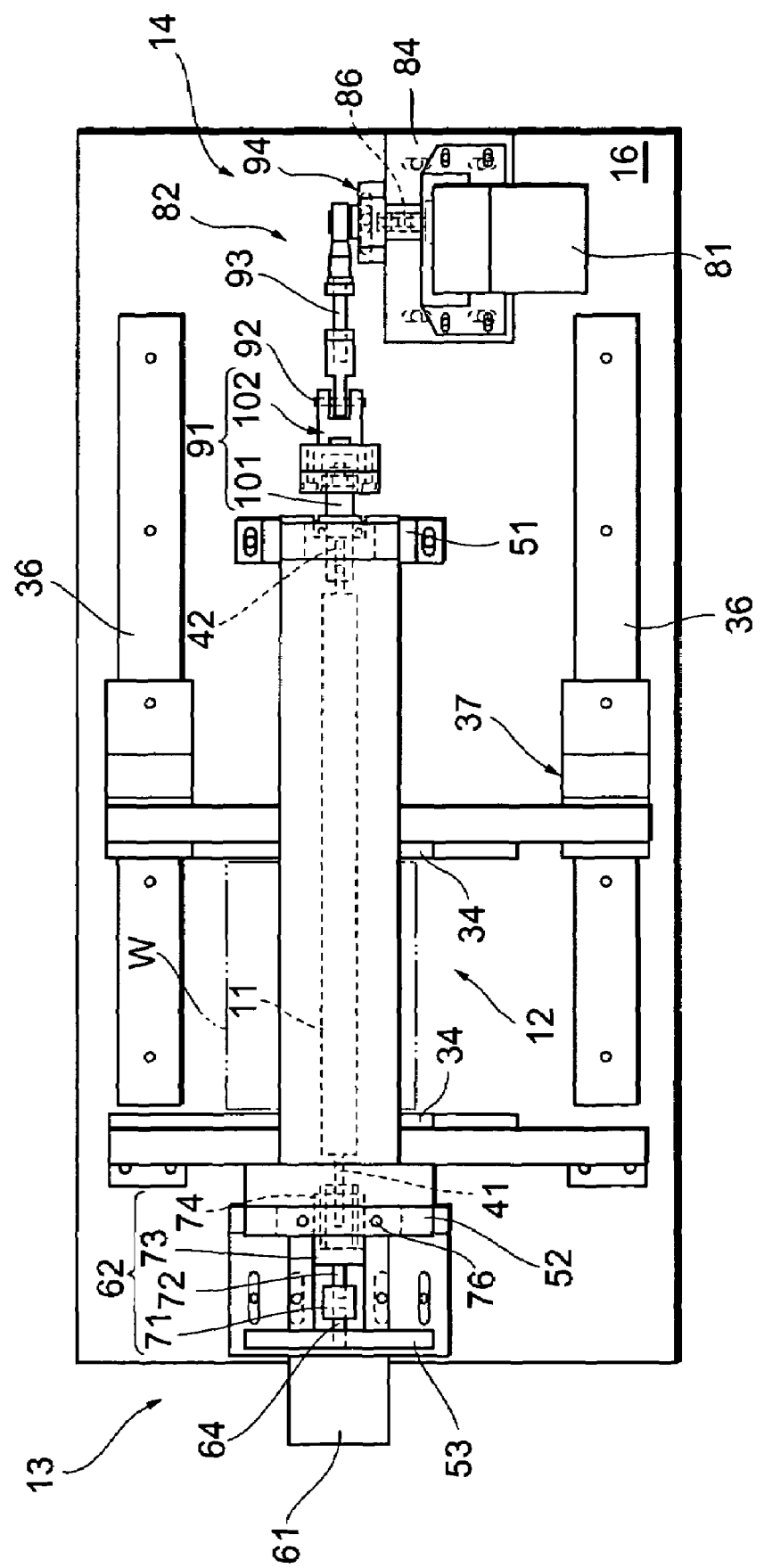
FIG. 4 is a plan view of the dust remover shown in FIG. 3.

As shown in FIGS. 3 and 4, the workpiece carrying unit 12 has: a pair of belt conveyors 31 and 31 located on either side of the workpiece W for carrying the workpiece W and supporting the lower parts of both ends of the workpiece W; a pair of drive motors 32 and 32 located on either side of the workpiece W for driving the belt conveyors 31 and 31 respectively; a pair of power transmission mechanisms 33 and 33 located either side of the workpiece W for transmitting the power from the drive motors 32 and 32 to the belt conveyors 31 and 31 respectively; and a pair of guides 34 and 34 located on either side of the workpiece W for guiding both sides of the workpiece W which is being carried. From among these components, only the guides 34 are shown in FIG. 4.

The drive motors 32 and 32 are composed of a DC (Direct Current) motor with a commutator and a brush, or a stepping motor. The pair of belt conveyors 31 and 31 faces the rotary brush 11 located above the workpiece W and carries the workpiece W in an anteroposterior direction in FIGS. 3 and 4 in such a manner that the workpiece W comes into contact with the rotary brush 11 and passes through the rotary brush 11.

The workpiece carrying unit 12 is equipped with a workpiece width adjustment mechanism 37 including a pair of rails 36 and 36 located on the front and back sides of the common base 16 on the mounting 3. The workpiece width adjustment mechanism 37 moves the belt conveyor 31, the drive motor 32, the power transmission mechanism 33, and the guide 34 all on the right side together in a horizontal direction in FIGS. 3 and 4. The workpiece width adjustment mechanism 37 allows workpieces W of different widths (lengths in the horizontal direction) to be carried.

Examples of types of the workpiece W include printed wiring boards, liquid crystal glass substrates, flexible substrates, ceramic substrates, plastic plates, liquid crystal display panels, vacuum trays, lenses, light guide plates, films, and paper.

The rotary brush 11 is composed of a so-called "conductive brush." Conductive fibers, each having a diameter of, for example, about several tens of micron-meters, are implanted around the periphery of a generally cylindrical brush body. The fiber-implanted part of the rotary brush 11 rotates in contact with the surface of the workpiece W, thereby brushing and removing dust from the surface of the workpiece W and also removing static electricity from the surface of the workpiece W.

The rotary brush 11 is configured to be capable of adjusting its height in a vertical direction, using a height adjustment mechanism including a ball plunger which is not shown in the drawings, so that the rotary brush 11 can be used for workpieces W of different thicknesses. Also, the rotary brush 11 is long in the horizontal direction so that it can be used for wide workpieces W. The right and left protruding ends 41 and 42 of the rotary brush 11 are formed as input parts for the brush rotation unit 13 and the back-and-forth brush movement unit 14 respectively.

Specifically speaking, rotational power of the brush rotation unit 13 is input from the left end 41 to the rotary brush 11 to make it rotate around its axis, and linear motion power of the back-and-forth brush movement unit 14 is input from the right end 42 to the rotary brush 11 to make it move back and forth along its axis. The right end 42 is connected to a slide shaft 101 of the unit 14, and this slide shaft 101 is supported by a first support stand 51 secured to the common base 16 in such a manner that the slide shaft 101 can rotate and move back and forth.

The brush rotation unit 13 has a motor 61 that is a drive source, and a power transmitter 62 for transmitting the rotation of the motor 61 to the rotary brush 11 while allowing the back-and-forth movement of the rotary brush 11. The motor 61 is composed of a DC motor with a commutator and a brush, or a stepping motor. The motor 61 is secured via a bracket 53 to a second support stand 52 fixed to the common base 16, and the output shaft 64 of the motor 61 is aligned along the same axis as the rotary brush 11.

Figure 5:
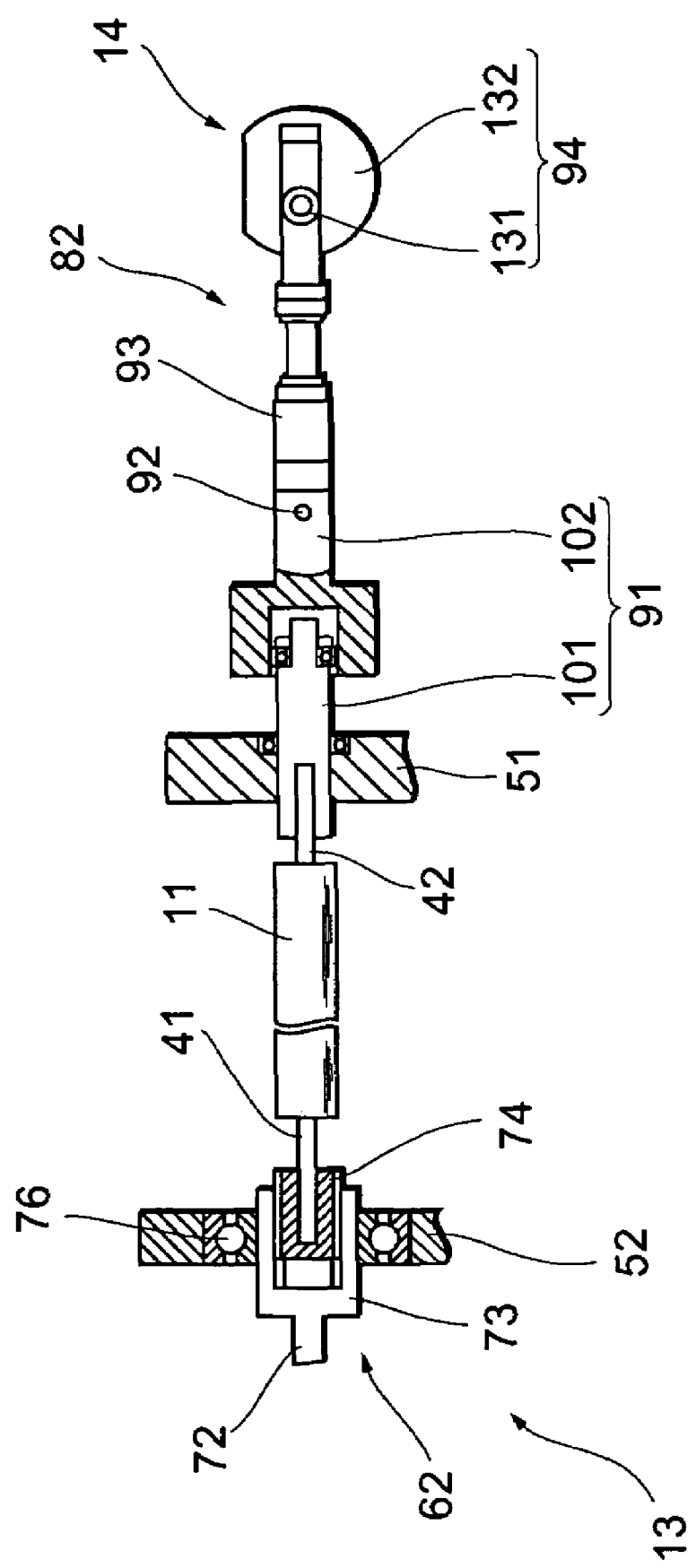
FIG. 5 shows the detailed configuration of components around the rotary brush.

The power transmitter 62 includes: a main shaft 72 connected via a coupling 71 to the output shaft 64; a spline boss 73 integrally formed with the main shaft 72; and a spline shaft 74. As shown in FIG. 5, the spline boss 73 is supported via a bearing 76 by the second support stand 52 in such a manner that the spline boss 73 can rotate. As shown in FIGS. 5, 5A, and 5B, the spline shaft 74 engages with the spline boss 73. The left end 41 is inserted and secured to the spline shaft 74.

The rotations of the motor 61 cause a straight-sided spline composed of the spline boss 73 and the spline shaft 74 (see FIGS. 5, 5A, and 5B) to rotate together. The rotary force of the motor 61 is transmitted via the above straight-sided spline to the rotary brush 11, causing the rotary brush 11 to rotate. While the rotary brush 11 is rotating, the back-and-forth movement of the rotary brush 11 along its axis by the back-and-forth brush movement unit 14 is also permitted. It is a matter of course that a ball spline can be used instead of the straight-sided spline.

The back-and-forth brush movement unit 14 has a motor 81 as a drive source, and a reciprocating slider crank mechanism 82 (power transmitter) for converting the rotary force of the motor 81 to the back-and-forth motion for the rotary brush 11 and transmitting the back-and-forth motion to the rotary brush 11 while allowing rotations of the rotary brush 11. The motor 81 is composed of a stepping motor or similar as in the case of the motor 61, and is secured to a motor base 84 provided on the common base 16.

The reciprocating slider crank mechanism 82 includes: a slider 91 for holding (or connecting) the right end 42 in such a manner that the right end 42 can rotate; a connecting rod 93 whose one end is connected via a connecting pint 92 to the slider 91; and a crank 94 that is connected to the other end of the connecting rod 93 and also to the output shaft 86 of the motor 81.

Figure 6:
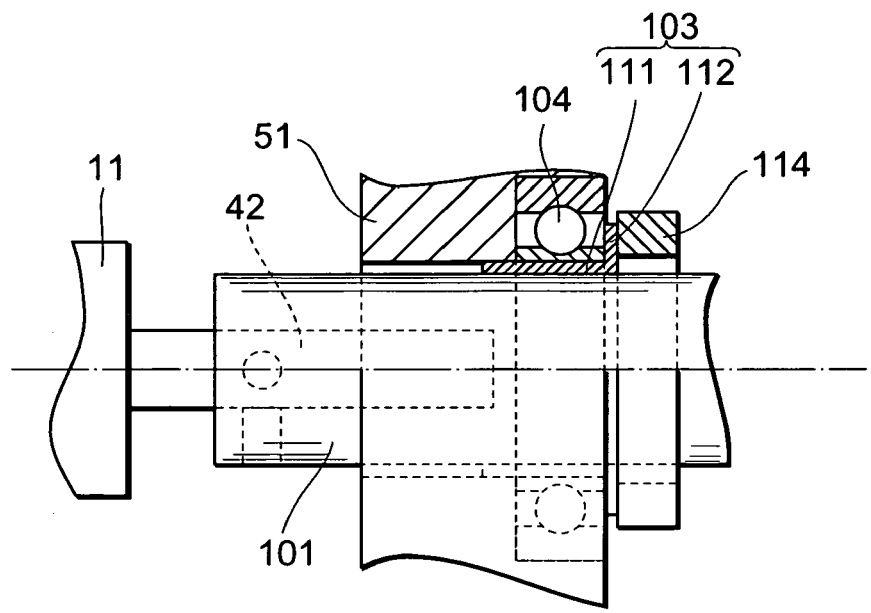
FIG. 6 is a partly sectioned plan view showing the detailed configuration of components around the right-side end of the rotary brush.

The slider 91 is aligned along the same axis as the rotary brush 11. The slider 91 is composed of: a slide shaft 101 to which the right end 42 is inserted and secured; and a joint 102 for connecting the slide shaft 101 to the connecting rod 93. As shown in FIG. 6, the left side of the slide shaft 101 to which the rotary brush 11 is secured is supported via a bush 103 and a bearing 104 by the first support stand 51 in such a manner that the left side of the slide shaft 101 can rotate and also move back and forth.

The bush 103 is composed of: a cylindrical part 111 sandwiched between the slide shaft 101 and the bearing surface of the bearing 104; and a flange 112 that is integrated with the cylindrical part 111 and in contact with the end face of the bearing 104. The bush 103 is supported by a bush holder 114 secured to the first support stand 51 and is held between the slide shaft 101 and the bearing 104 so that it will not fall out.

Figure 7:
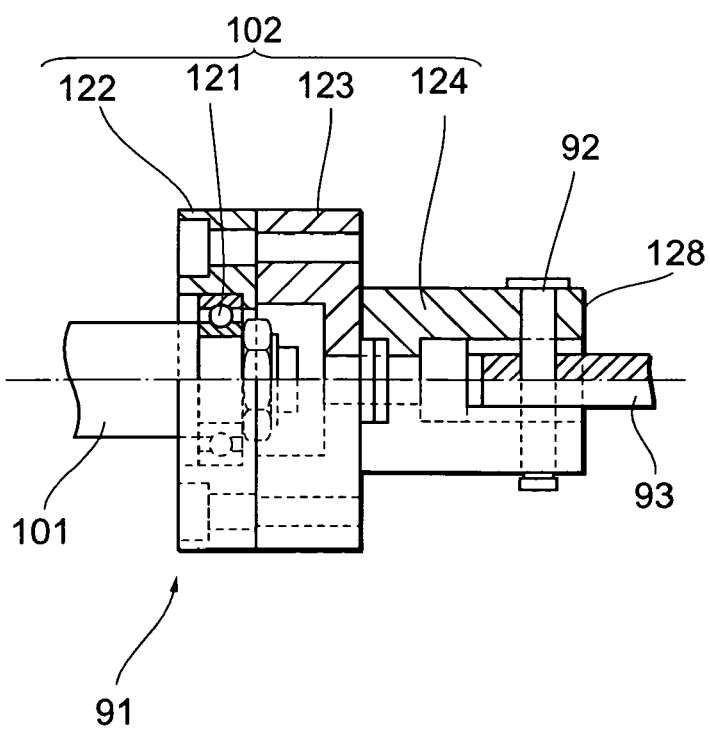
FIG. 7 is a half sectioned view showing the detailed configuration of components around a slider of a back-and-forth brush movement unit.

As shown in FIG. 7, the joint 102 has: a bearing 121 for supporting the right end of the slide shaft 101 so that the right end can rotate; a bearing holder 122 incorporating the bearing 121; a mounting base 123 secured to the bearing holder 122 with bolts; and a joint body 124 extending along the same axis as the slide shaft 101 from the end face of the mounting base 123. The joint body 124 has a two-forked yoke 128 on its top end, and this yoke 128 is connected as a universal joint via a connecting pin 92 to the end of the connecting rod 93.

Accordingly, the joint 102 having the above-described configuration transmits the back-and-forth moving power via the connecting rod 93 to the slide shaft 101, making the slide shaft 101 move back and forth along its axis, and transmission of the rotary force of the slide shaft 101, which rotates integrally with the rotary brush 11, to the connecting rod 93 can be blocked. Incidentally, as shown in FIGS. 5 and 9A through 9D, the bearing holder 122, the mounting base 123, and the joint body 124 may be configured as one component.

Figure 8:
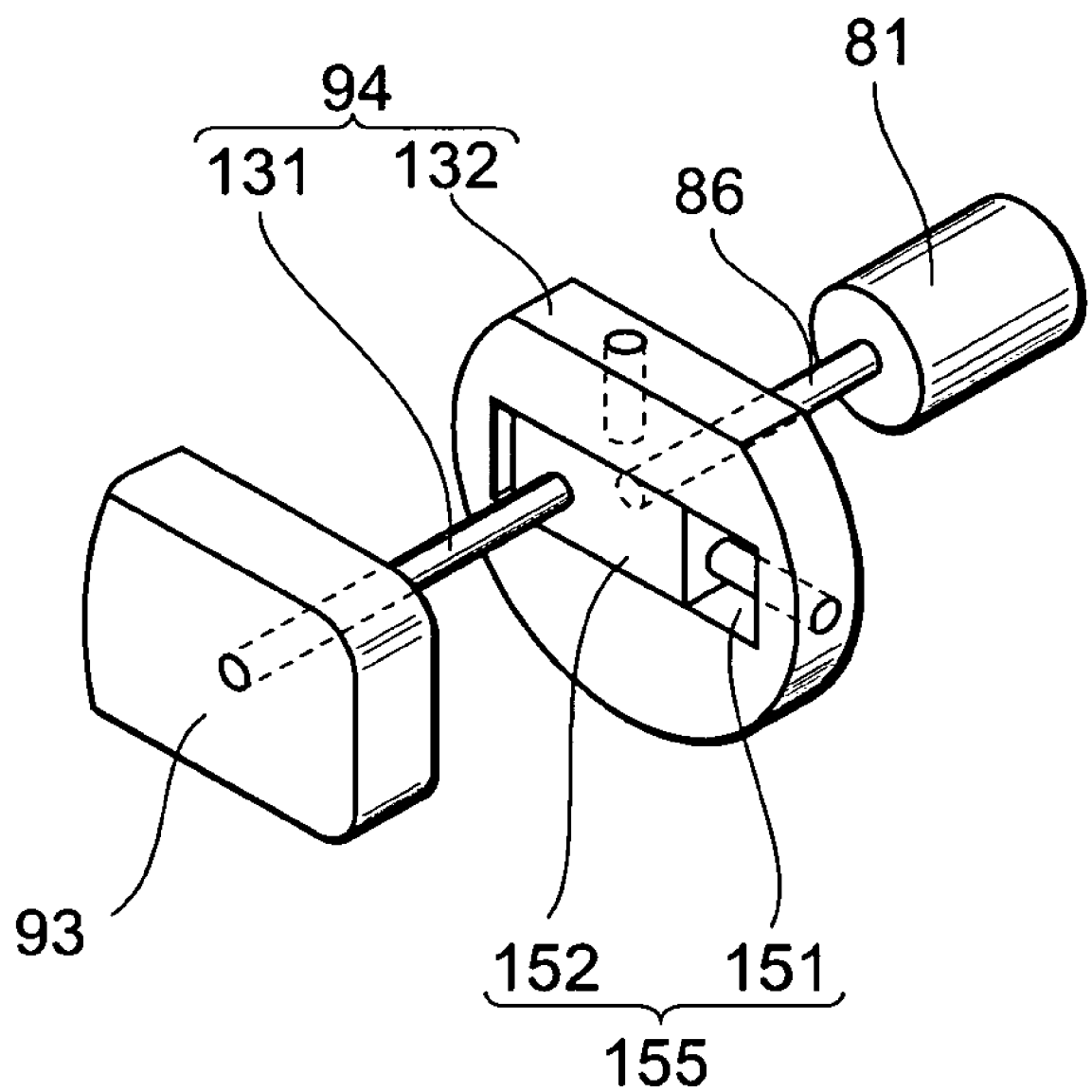
FIG. 8 is a schematic perspective view showing the configuration of components around a crank of the back-and-forth brush movement unit.
Figure 9A:
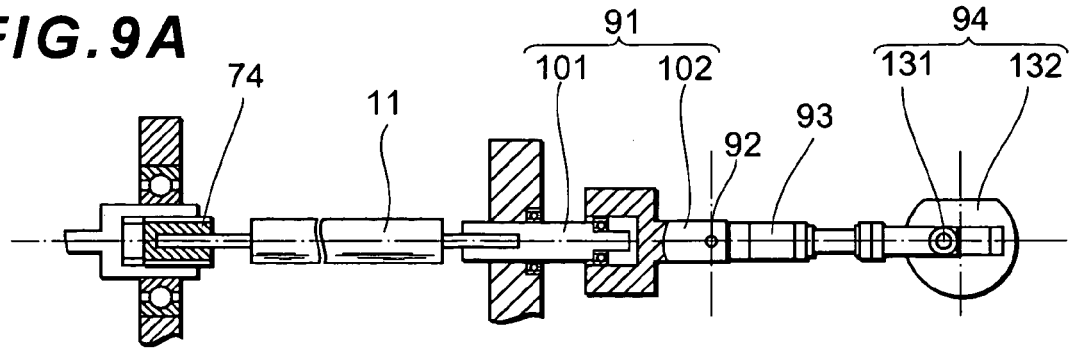
FIGS. 9A, 9B, 9C, and 9D depict the back-and-forth motion of the rotary brush driven by the back-and-forth brush movement unit.
Figure 9B:
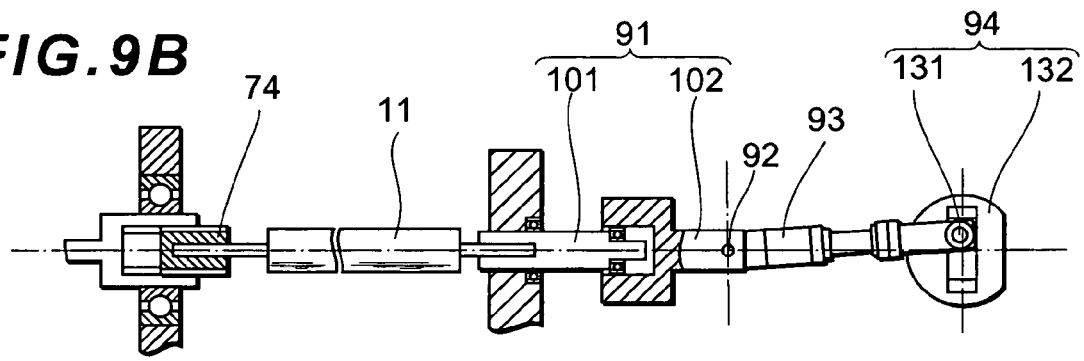
Figure 9C:
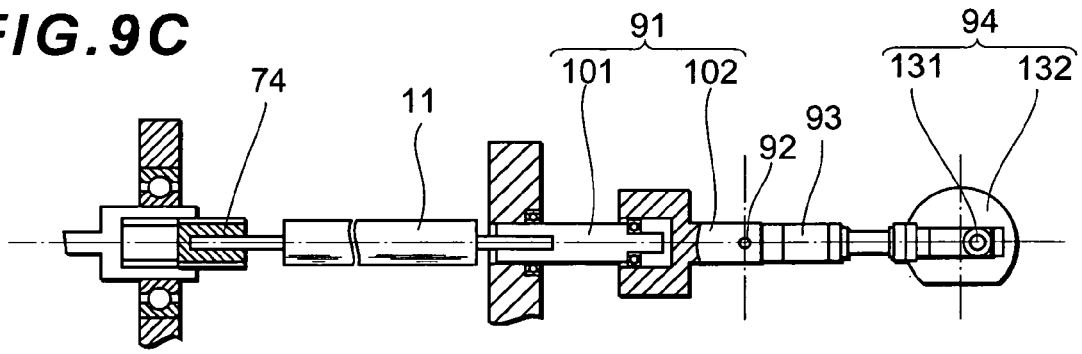
Figure 9D:
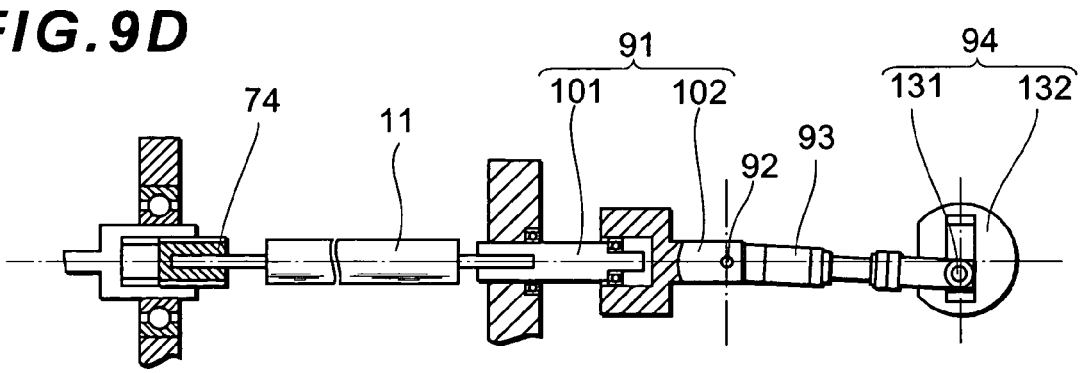

As shown in FIGS. 5 and 8, the crank 94 has: a rotating shaft 131 connected to the second end of the connecting rod 93; and an eccentric plate 132. The rotating shaft 131 is secured to the eccentric plate 132 at a position where the rotating shaft 131 is decentered relative to the output shaft 86 of the motor 81. The output shaft 86 is secured to the central part of the back end face of the eccentric plate 132, a long straight recess 151 is made in the front end face of the eccentric plate 132, and the recess 151 passes through the center of the front end face of the eccentric plate 132. An adjustment block 152 to which the rotating shaft 131 is secured is mounted in the recess 151 in such a manner that the adjustment block 152 can slide.

The adjustment block 152 is configured so that both ends of the adjustment block 152 in the lengthwise direction can be secured with screws from outside of the eccentric plate 132 and the end face of the adjustment block 152 in a direction perpendicular to the lengthwise direction can be also secured with a screw from outside of the eccentric plate 132. Part of the eccentric plate 132 is cut off to form the plane end face perpendicular to the lengthwise direction of the adjustment block 152 so that the end face can receive a screw head and be secured firmly. Eccentricity of the rotating shaft 131 with respect to the output shaft 86 can be adjusted by adjusting a slide position of the adjustment block 152.

Specifically speaking, an adjuster 155 capable of adjusting the crank length—the connection distance between the connecting rod 93 and the motor 81—is composed of the eccentric plate 132, the recess 151, the adjustment block 152, and the screws. The adjuster 155 incorporated into the crank 94 makes it possible to adjust the amount or amplitude of back-and-forth movement of the rotary brush 11 according to the type of the workpiece W.

The back-and-forth movement of the rotary brush 11 will be described briefly by referring to the schematic cross-sectional views in FIGS. 9A to 9D. When the motor 81 is driven and starts rotating, the rotary brush 11 and other relevant components move and change their positions from the initial position shown in FIG. 9A to the position shown in FIG. 9B. When this happens, the spline shaft 74, slide shaft 101, and joint 102 that are aligned along the same axis as the rotary brush 11 moves in a straight line integrally with the rotary brush 11. Subsequently, the eccentric plate 132 is rotated half-turn and the relevant components take the position shown in FIG. 9C. At that moment, the rotary brush 11 moves to the right in a straight line to the maximum extent possible. When the motor 81 further rotates and makes the eccentric plate 132 rotate half-turn, the rotary brush 11 and other relevant components move and change their positions from the position in FIG. 9C to the position in FIG. 9D, and then back to the position in FIG. 9A. In the position shown in FIG. 9A, the rotary brush 11 moves to the left in a straight line to the maximum extent possible.

In the dust remover 1 according to this embodiment as described above, the rotary brush 11 can be made to rotate in contact with the surface of the workpiece W being carried and also move back and forth along its axis by driving the unit 13 and the unit 14 in synchronization with the movement of the workpiece carrying unit 12. Accordingly, the dust remover 1 can more efficiently and sufficiently remove dust from the workpiece W.

Instead of using the configuration according to this embodiment in which the workpiece W is carried, the motion to remove dust from the entire surface of the workpiece W can be performed by setting the workpiece W at a specified non-movable position and moving the rotary brush 11 back and forth relative to the workpiece and also in a direction perpendicular to the back-and-forth motion direction. In this case, for example, a movement base for integrally supporting the back-and-forth brush movement unit 14 and the brush rotation unit 13 may be provided and the movement base may be moved by, for example, ball-screw operation in one direction, which is the above-described direction the workpiece W is carried, in synchronization with the movement of the unit 13 and the unit 14.

Alternatively, instead of using the configuration in which the rotary brush 11 is made to actively move back and forth, the workpiece W may be moved relative to the rotary brush 11, which is located at a specified position, in a direction perpendicular to the direction the workpiece W is carried (that is, the back-and-forth movement direction of the rotary brush 11) while the workpiece W is being carried. In this case, for example, a movement base for supporting the workpiece carrying unit 12 and a fixed base for supporting the brush rotation unit 13 are provided. Then, the movement base may be moved by, for example, ball-screw operation or similar in the direction perpendicular to the direction in which the workpiece W is carried by the workpiece carrying unit 12, in synchronization with the movement of the brush rotation unit 13 and the workpiece carrying unit 12.

In other words, the dust remover 1 may be configured so that the rotary brush 11 that is rotating is relatively moved in X and Y axis directions relative to the workpiece W. These two relative movement directions may be directions that intersect with each other and are not perpendicular to each other, depending on the type of the workpiece W. However, in consideration of ease of assembly of the various components of the dust remover 1, directions perpendicular to each other should preferably be used as described above.

Second Embodiment

Figure 10:
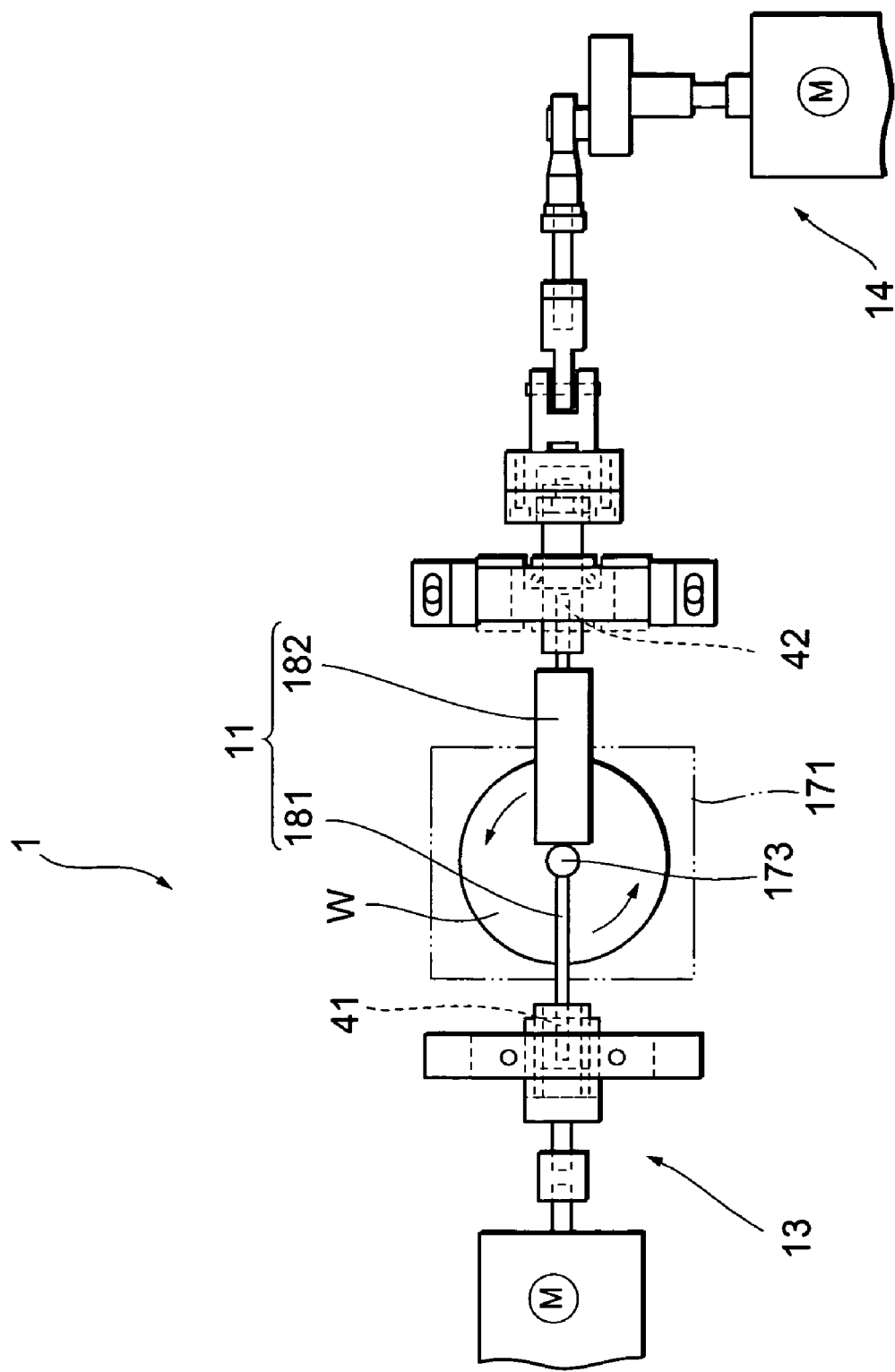
FIG. 10 is a schematic plan view of a dust remover according to a second embodiment of the invention.

Next, referring to FIG. 10, a second embodiment of the dust remover 1 will be described, focusing on differences with the previous embodiments. The workpiece W used in this embodiment has a disk-shaped contour, and examples of the workpiece W include silicon semiconductor wafers and disk media such as CDs (compact disks). Accordingly, a workpiece rotation unit 171 for rotating the workpiece W around its center 173 is employed in the second embodiment, instead of the workpiece carrying unit 12 in the first embodiment.

The workpiece rotation unit 171 includes: a rotating shaft (not show in the drawing) located along the same axis as the center 173 of the workpiece W; and a rotating table (not shown in the drawing) mounted at the top end of the rotating shaft, wherein the workpiece W can be mounted on the rotating table. The rotary brush 11 is located above the workpiece rotation unit 171, and the brush rotation unit 13 and the back-and-forth brush movement unit 14 are connected to the rotary brush 11.

The rotary brush 11 is composed of: a pair of rotating shafts 181 integrally formed with the right and left ends 42 and 41 of the rotary brush 11; and a brush body 182 that is fixed to the rotating shafts 181 and has conductive fibers implanted around its periphery. The rotating shafts 181 extend across the center 173 of the workpiece W. The brush body 182 extends from the central part of the workpiece W to a position slightly beyond the periphery of the workpiece W. The back-and-forth brush movement unit 14 makes the brush body 182 together with the rotating shafts 181 move back and forth along a radius of the workpiece W.

The dust removal motion of the dust remover 1 according to the second embodiment is performed by driving the brush rotation unit 13 and the back-and-forth brush movement unit 14 in synchronization with the rotation of the workpiece W by the workpiece rotation unit 171. The rotary brush 11 rotates around its shaft center and also moves back and forth along its axis relative to the rotating workpiece W. The rotary brush 11 is in contact with the workpiece W and removes dust from the surface of the workpiece W. As a result, processing for removing dust from the entire surface of the disk-shaped workpiece W can be implemented efficiently.

Third Embodiment

Figure 11:
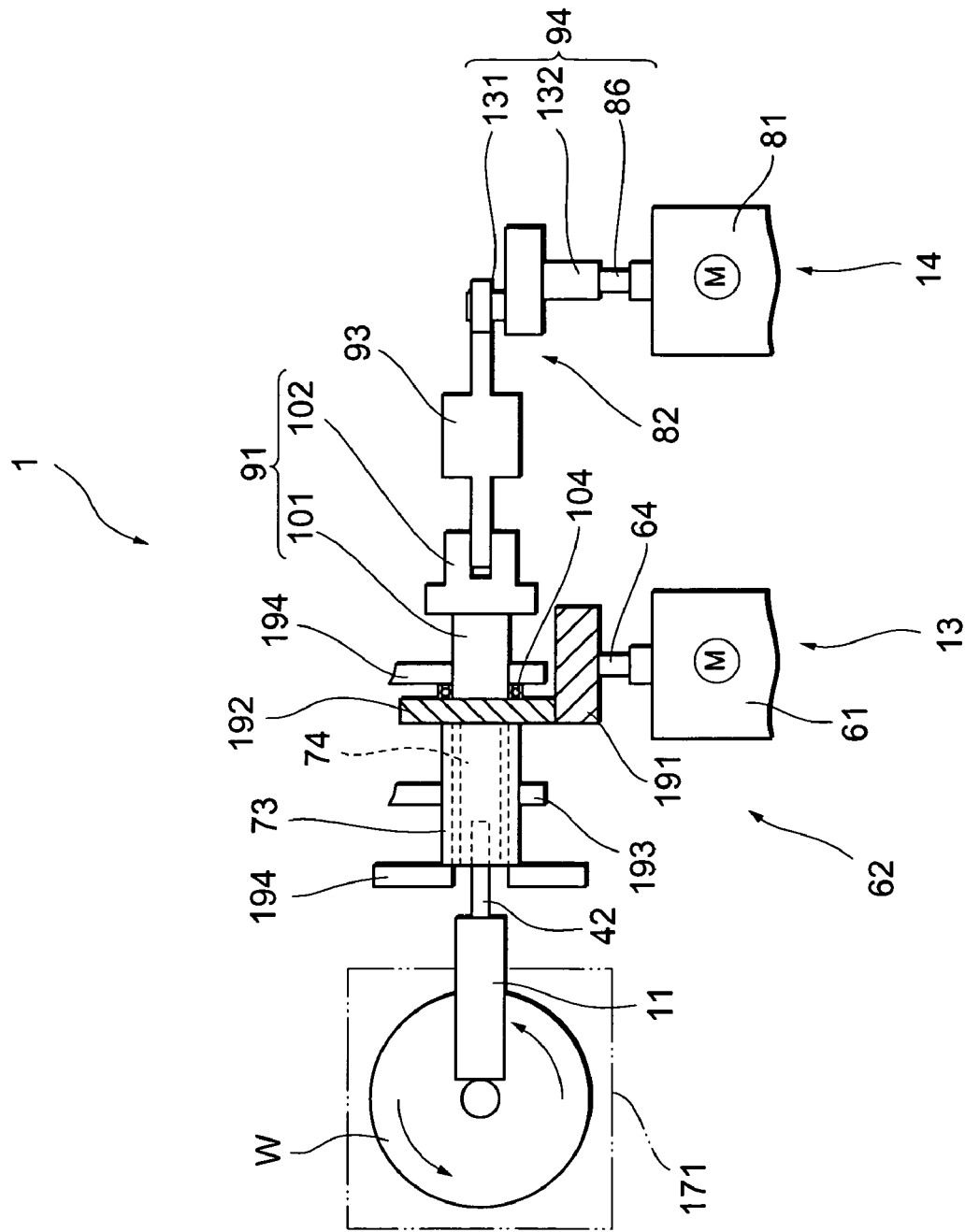
FIG. 11 is a schematic plan view of a dust remover according to a third embodiment of the invention.

Next, a dust remover 1 according to the third embodiment, a variation of the second embodiment, will be described below with reference to FIG. 11. In the first and second embodiments, the right and left ends 42 and 41 of the rotary brush 11 function as the input parts for the back-and-forth brush movement unit 14 and the brush rotation unit 13 respectively; and the back-and-forth brush movement unit 14 is located on the right side of the workpiece carrying unit 12 and the workpiece rotation unit 171, while the brush rotation unit 13 is located on the left side of the workpiece carrying unit 12 and the workpiece rotation unit 171. In the third embodiment, the power from the brush rotation unit 13 and the back-and-forth brush movement unit 14 is input from one end 42 of the rotary brush 11, and these units 13 and 14 are concentrated on one side of the workpiece rotation unit 171.

A power transmitter 62 for the brush rotation unit 13 is composed of: an output driving gear 191 fixed on the output shaft 64 of the motor 61; an input driving gear 192 engaging with the output driving gear 191; a spline boss 73 integrally formed with the input driving gear 192; and a spline shaft 74 that engages with the spline boss 73 and to which the right end 42 of the rotary brush 11 is inserted and secured. The spline boss 73 is supported by a receiver 193 in such a manner that the spline boss 73 can rotate.

The spline boss 73 and the spline shaft 74 form a straight-sided spline just like the aforementioned embodiments. When the spline boss 73 receives the power from the motor 61 and rotates via the output driving gear 191 and the input driving gear 192, the spline shaft 74 and the rotary brush 11 rotate integrally with the spline boss 73. While rotating in this manner, the spline shaft 74 and the rotary brush 11 are also driven by the back-and-forth brush movement unit 14 and are allowed to move back and forth. The reference numeral 194 in FIG. 11 indicates position control guides for the input driving gear 192. The guides 194 prevent displacement of the rotary brush 11 and other relevant components.

The power transmitter for the back-and-forth brush movement unit 14 is composed of the reciprocating slider crank mechanism 82 as described above. Specifically speaking, the reciprocating slider crank mechanism 82 includes the slider 91, the connecting rod 93, and the crank 94. The slider 91 is composed of: the slide shaft 101 connected to and aligned along the same axis as the spline shaft 74; and the joint 102 for connecting the slide shaft 101 to the connecting rod 93.

The slide shaft 101 is supported by the bearing 104 and other relevant components in such a manner that the slide shaft 101 can rotate. The joint 102 transmits the back-and-forth moving power via the connecting rod 93 to the slide shaft 101 and makes the slide shaft 101 move back and forth along its axis. The joint 102 also blocks transmission of the rotary force from the slide shaft 101, which rotates integrally with the rotary brush 11, to the connecting rod 93.

As described above, the dust remover 1 according to the third embodiment can efficiently remove dust from the surface of the workpiece W by rotating the rotary brush 11 in contact with the workpiece W by driving the brush rotation unit 13 and the back-and-forth brush movement unit 14 in synchronization with the rotations of the workpiece W by the workpiece rotation unit 171.

The aforementioned embodiments described the case where the rotary brush 11 is brought into direct contact with the surface of the workpiece W. However, even if the rotary brush 11 is not in contact with the surface of the workpiece W, that is, even if the rotary brush 11 is located close to the workpiece W with a slight gap between the rotary brush 11 and the surface of the workpiece W, the rotary brush 11 can remove dust from the surface of the workpiece W. In addition, the motor 81 may be controlled to adjust the back-and-forth movement speed of the rotary brush 11 according to the type of the workpiece W and/or the environment where the dust remover 1 is used. Also, the motor 61 may be controlled to adjust the rotational speed of the rotary brush 11.

Furthermore, if the motor 61 also functions as the motor 81, a power dividing unit for dividing power from the motor 61 and distributing it to the brush rotation unit 13 and the back-and-forth brush movement unit 14 may be provided. If this configuration is adopted in the third embodiment, the power dividing unit includes: a drive pulley provided at the output shaft 64 of the motor 61 with a gap between the drive pulley and the output driving gear 191; an idle pulley provided instead of the eccentric plate 132 of the crank 94; and a belt put across the drive pulley and the driven pulley. Then, a rotating shaft 131 (crank pin) connected to the right end of the connecting rod 93 may be provided at a position decentered from the rotation center of the driven pulley.

In the aforementioned embodiments, the motor 81 is used as the actuator of the back-and-forth brush movement unit 14, but it is apparent that an air cylinder device or similar can be used instead of the motor 81. However, in consideration of adjustment of, for example, the back-and-forth movement speed of the rotary brush 11 and ease of replacing the rotary brush 11, the configurations of the aforementioned embodiments should preferably be used.

The invention claimed is:

1. A dust remover comprising:
   a rotary brush for removing dust from a workpiece;
   a workpiece carrying unit for carrying the workpiece in a direction intersecting with the axis of the rotary brush;
   a brush rotation unit for rotating the rotary brush around its axis in synchronization with the movement of the workpiece carrying unit; and
   a back-and-forth brush movement unit for moving the rotary brush back and forth along its axis in synchronization with the movement of the workpiece carrying unit,
   wherein the brush rotation unit includes:
   a motor as a drive source; and
   a power transmitter that transmits rotary force of the motor to the rotary brush while allowing the rotary brush to move back and forth; and
   wherein the back-and-forth brush movement unit includes:
   an actuator as a drive source; and
   a power transmitter that converts power of the actuator to a back-and-forth motion for the rotary brush and transmits the back-and-forth motion to the rotary brush while allowing the rotary brush to rotate.

2. The dust remover according to claim 1, wherein an input part for the brush rotation unit is formed at one end of the rotary brush, and an input part for the back-and-fourth brush movement unit is formed at the other end of the rotary brush.

3. The dust remover according to claim 1, wherein the actuator is composed of a motor, and
   wherein the power transmitter of the back-and-forth brush movement unit is composed of a reciprocating slider crank mechanism having a slider that holds the end of the rotary brush in such a manner that the end of the rotary brush can rotate.

4. The dust remover according to claim 3, wherein the reciprocating slider crank mechanism includes:
   a connecting rod with its one end connected to the slider; and
   a crank connected to the other end of the connecting rod and also to an output part of the motor; and
   wherein an adjuster capable of adjusting the connection distance between the connecting rod and the motor is incorporated into the crank.

5. The dust remover according to claim 1, wherein the direction in which the workpiece is carried by the workpiece carrying unit is perpendicular to the direction in which the rotary brush is moved back and forth by the back-and-forth brush movement unit.

6. The dust remover according to claim 1, wherein the brush is configured so that it can cone into contact with the workpiece.

7. A dust remover comprising:
   a rotary rush for removing dust from the surface of a disk-shaped workpiece;
   a workpiece rotation unit for rotating the workpiece around its center;
   a brush movement unit for moving the brush back and forth along a radius of the workpiece in synchronization with the rotation of the workpiece by the workpiece rotation unit; and
   a brush rotation unit for rotating the brush around its axis in synchronization with a movement of the workpiece rotation unit,
   wherein the brush rotation unit includes:
   a motor as a drive source; and
   a power transmitter that transmits rotary force of the motor to the brush while allowing the brush to move back and forth; and
   wherein the brush movement unit includes:
   an actuator as a drive source; and
   a power transmitter that converts power of the actuator to a back-and-forth motion for the brush and transmits the bank-and-forth motion to the brush while allowing the brush to rotate.

8. The dust remover according to claim 7, wherein the brush is configured so that it can come into contact with the workpiece.

9. A method for removing dust from a workpiece using a dust remover by relatively moving a brush positioned opposite the workpiece, wherein the brush is moved relative to the workpiece in a first direction and also in a second direction intersecting with the first direction,
   wherein the dust remover comprises:
   a workpiece carrying unit for carrying the workpiece in the first direction;
   a brush rotation unit for rotating the brush around its axis in synchronization with the movement of the workpiece carrying unit; and
   a back-and-forth brush movement unit for moving the brush back and forth along the second direction in synchronization with the movement of the workpiece carrying unit,
   wherein the brush rotation unit includes:
   a motor as a drive source; and
   a power transmitter that transmits rotary force of the motor to the brush while allowing the brush to move back and forth;

and wherein the back-and-forth brush movement unit includes:
an actuator as a drive source; and
a power transmitter that converts power of the actuator to a back-and-forth motion for the brush and transmits the back-and-forth motion to the brush while allowing the brush to rotate.

10. The dust removal method according to claim 9, wherein the brush is composed of a rotary brush, and wherein the rotary brush is made to rotate in contact with the workpiece while the rotary brush is moved relative to the workpiece in the first and second directions.

* * * * *